United States Patent
Miyashiro et al.

(10) Patent No.: US 7,894,039 B2
(45) Date of Patent: Feb. 22, 2011

(54) EXPOSURE APPARATUS AND METHOD, AND DEVICE MANUFACTURING METHOD

(75) Inventors: Ryuhei Miyashiro, Tokyo (JP); Youzou Fukagawa, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 972 days.

(21) Appl. No.: 11/739,912

(22) Filed: Apr. 25, 2007

(65) Prior Publication Data
US 2007/0268472 A1 Nov. 22, 2007

(30) Foreign Application Priority Data
May 1, 2006 (JP) .............................. 2006-127902

(51) Int. Cl.
G03B 27/42 (2006.01)
(52) U.S. Cl. .............................. 355/53; 355/55; 355/72; 355/77
(58) Field of Classification Search .................... 355/30, 355/53, 72, 77
See application file for complete search history.

(56) References Cited

U.S. PATENT DOCUMENTS

| | | | |
|---|---|---|---|
| 5,805,866 A | 9/1998 | Magome et al. | |
| 6,854,105 B2 | 2/2005 | Fukagawa | 716/19 |
| 6,947,119 B2 | 9/2005 | Fukagawa | 355/52 |
| 7,084,957 B2 | 8/2006 | Fukagawa | 355/53 |
| 7,230,692 B2 | 6/2007 | Fukagawa et al. | 356/124 |
| 7,330,800 B1 * | 2/2008 | Good et al. | 702/83 |
| 2002/0037460 A1 | 3/2002 | Takahashi | 430/22 |
| 2003/0020889 A1 | 1/2003 | Takahashi | 355/53 |
| 2004/0237061 A1 | 11/2004 | Kahng et al. | 716/19 |
| 2007/0064211 A1 * | 3/2007 | Hatai | 355/55 |
| 2007/0115458 A1 | 5/2007 | Fukagawa et al. | 356/124 |

FOREIGN PATENT DOCUMENTS

| | | |
|---|---|---|
| JP | 7-226359 | 8/1995 |
| KR | 2002-0011864 | 2/2002 |

OTHER PUBLICATIONS

Korean Office Action dated Apr. 10, 2008, issued in corresponding Korean patent application No. 10-2007-0042292.

* cited by examiner

*Primary Examiner*—Edward J Glick
*Assistant Examiner*—Mesfin T Asfaw
(74) *Attorney, Agent, or Firm*—Fitzpatrick, Cella, Harper & Scinto

(57) ABSTRACT

An exposure apparatus for exposing a substrate to light. A substrate stage holds the substrate and is to be moved. A measuring device measures a positional deviation amount of a mark on the substrate held by the substrate stage. A computing device determines a coefficient of a linear expression that approximates the measured positional deviation amount of each mark and is linear with respect to a term including at least one of an X coordinate to the Nth power and a Y coordinate to the Nth power, where N is an integer not less than zero, and a control device controls a position of the substrate stage in accordance with a target position determined based on the linear expression to expose a shot to the light. The computing device determines the coefficient in accordance with an integer programming method so as to minimize a number of marks, each of which satisfies a condition that a difference between the measured positional deviation amount and the approximated positional deviation amount is out of a predetermined allowable range.

13 Claims, 11 Drawing Sheets

EXPOSURE APPARATUS AND METHOD, AND DEVICE MANUFACTURING METHOD

This application claims priority from Japanese Patent Application No. 2006-127902, filed May 1, 2006, which is hereby incorporated by reference.

FIELD OF THE INVENTION AND RELATED ART

This invention relates to an exposure apparatus and a method, and to a device manufacturing method.

In the manufacture of devices such as semiconductor devices, for example, exposure apparatuses are used to transfer a pattern, such as a circuit pattern, formed on a reticle, onto a wafer through a projection optical system. Wafers having completed such an exposure process are then processed by various chemical and physical treatments and, subsequently, they are loaded again into the exposure apparatus. In the exposure apparatus, the positions of alignment marks formed on each wafer are measured by use of a scope (microscope), and various parameters (coefficients) of relational expressions for approximating the amount of positional deviation of exposure regions (shots) on the wafer, resulting from the above-described processes or caused by wafer chucking, for example, are calculated. Here, the "positional deviation" refers to a linear component such as, for example, translation, magnification and rotation of all the exposure regions as a whole, as well as translation, magnification and rotation in each exposure region.

The array (layout) of exposure regions on the wafer may be distorted by processes such as etching, CVD (chemical vapor deposition) and CMP (chemical mechanical polishing), which are carried out after the pattern transfer process. Here, as long as the distortion is a linear component that can be corrected by an alignment process to be done in the exposure apparatus, it is not a difficult problem.

However, there are cases where the array or shape of patterns transferred to the wafer surface is distorted non-linearly, due to the processes made after the pattern transfer process, and satisfactory registration precision is unattainable by the alignment process based on linear component correction only.

A proposal has been made in this regard to increase the number of alignment-mark measurement points, and also, to correct non-linear components in parallel. However, this increase in the number of marks to be measured is followed by an increase in the probability that extraordinary values (outliers) are found in the measured values of positional deviation amounts (positional error) of the alignment marks. If, in such a case, there is extraordinariness in the mark measured values, the registration error becomes worse, to the contrary. A proposal has been made in this respect to detect and to exclude extraordinary values. Japanese Laid-Open Patent Application No. 07-226359 discloses a method in which any extraordinary measurement points are excluded out of the sample shots for alignment measurement, and in which linear and non-linear components of the remaining measurement points are calculated in accordance with the least square method.

Although this method can avoid the problem described above, it is not an optimum solution (details will be discussed later). Furthermore, for measurement of non-linear components, in each wafer, a large number of alignment marks have to be measured. This descreases the throughput.

On the other hand, as long as the process is the same, non-linear components to be produced there are very similar.

In consideration of this, generally, the alignment measurement made to each wafer is limitedly carried out in relation to a linear component whose variation should not be disregarded. On the other hand, with regard to non-linear distortion of the shot array or a shape, which is less changeable, it is determined statistically on the basis of measurements made beforehand, and then used in the alignment process. An example is shown in FIG. 1, wherein a wafer has a plurality of shots 1 each having a plurality of registration marks 2, and any deviations of these marks 2 are measured by use of a microscope. Subsequently, during an actual exposure process, the target positions of a wafer stage or distortion of a projection optical system, for example, are corrected on the basis of the measurements described above, so as to reduce the registration errors.

However, if there is a shot which is extraordinarily largely deviated from the array, and the approximation of positional errors based on the least square method is still carried out to all the shots, including this shot, the registration error would be deteriorated evenly. It is even possible that a large number of semiconductor chips become defective. In order to decrease the number of defective chips, it would be better to determine the correction amount while disregarding extraordinary shots having a large deviation. This is similar to the problem involved in the alignment correction, described above.

Hence, there will be a method in which, as in alignment correction, measurement points having a large registration error are excluded as outlier points. However, in order to accomplish such an exclusion, if the total number of measurement points is n and the number of measurement points to be excluded is m, arithmetic operations have to be made with regard to the combination of nCm. If n and m are large, an enormous number of combinations must be examined. For this reason, this method is practicable only when the number of measurement points to be excluded is very small. The method disclosed in the aforementioned patent document is not an optimum solution, in this respect.

Now, a method in which positional errors of shots are approximated in accordance with the least square method, without exclusion of extraordinary values, will be explained. For evaluation of correction precision according to this method, the inventor of the subject application actually measured the non-linear distortion of an array due to process factors. More specifically, the inventor measured registration marks 2 provided at centers of the shots 1 shown in FIG. 2, and showed the deviations of these marks with respect to the x and y directions, detected by that measurement, in a grid-like map of FIG. 3. Only a non-linear and very complicated array distortion 4 is illustrated there.

Furthermore, in order to figure out the registration errors quantitatively, the amount of deviations in the x and y directions were plotted as curves 5 and 6 shown in FIG. 4. Then, those points on the curves 5 and 6 having a relatively large absolute value were chose and plotted as a curve 7, and defective measurement points having a registration error greater than an allowable value were circled, as in circles 8. The number of defective measurement points is shown in the drawing. In the example of FIG. 4, wherein the allowable value was 10 nm, among the measurement points of a number one hundred fifty-seven, a total of forty-seven defective measurement points were included.

Subsequently, with regard to the mode capable of correcting the shot array in the exposure apparatus, the following six modes were set: 0-th order mode in which the same shift is applied to all the measurement points; first order modes in which shifts being proportional to the measurement position coordinates x and y on the wafer are applied; and second order modes in which shifts being proportional to x2, xy and y2 are applied. The coefficients of proportion in these modes were calculated in accordance with a simple least square method. Here, the amount of deviation of the registration error of the shots having been calculated on the basis of these coefficients, with respect to the measured registration error, is shown in FIG. 5.

Curves 9 and 10 of FIG. 5 depict the amount of deviations in the x and y directions, respectively. Those points on the curves 9 and 10 having a relatively large absolute value were chosen and plotted as a curve 11. In that example, the number of defective measurement points 12 having a deviation amount greater than the allowable value decreased to sixteen.

In the method in which linear and non-linear components are detected on the basis of alignment measurement and, also, in the method in which the non-linear component is detected beforehand on the basis of registration inspection, or the like, approximation of the deviation amount is carried out in accordance with the least square method, so that the square sum of differences between the amount of positional deviation (or the amount of registration error) of alignment marks and the approximate values of them is minimized. However, the optimum alignment process should be an operation which assures that a largest number of non-defective chips are produced from a single wafer. In this respect, although the least square method may provide a quasi-optimum approximation solution, an optimum approximation solution is not always derived therefrom. Even if the solution based on the least square method comes close to an optimum solution by excluding some largely outlying measured values, the obtained result is still a quasi-optimum approximation solution, and not an optimum solution.

SUMMARY OF THE INVENTION

The present invention has been made on the basis of the findings described above, found by the inventor of the subject application.

The present invention, in one aspect thereof, provides a unique and an improved exposure apparatus, and a method, and a device manufacturing method, by which a linear relational expression for approximating measured positional deviations of marks is not obtainable.

The present invention in another aspect assures that, for a certain allowable condition for the registration error, the position correcting amount for the exposure region or regions is calculated so as to provide a largest number of measurement points satisfying that condition.

The present invention, in a further aspect, enables that, by minimizing the largest absolute value of registration errors at the measurement points satisfying the allowable condition, a robust optimum solution, being resilient even to any errors in the position correction for the exposure region, is provided.

Here, in accordance with one aspect, the present invention provides an exposure apparatus for exposing a substrate, the apparatus comprising a substrate stage configured to hold the substrate and to move, a measuring device configured to measure a positional deviation amount of a mark on the substrate held by the substrate stage, a computing device configured to determine a linear expression for approximating positional deviation amounts measured by using the measuring device, and a control device configured to control a position of the substrate stage in accordance with a target position based on the linear expression, for exposure of an exposure region on the substrate, wherein the computing device is configured to determine the linear expression in accordance with an integer programming method, so as to minimize the number of marks having a difference between a mark positional deviation amount as measured by the measuring device and a mark positional deviation amount as approximated in accordance with the linear expression, which difference is out of a predetermined allowable range.

In accordance with another aspect, the present invention provides an exposure method for exposing a substrate, the method comprising a measuring step arranged to measure positional deviation amounts of marks on a substrate held by a substrate stage, a computing step arranged to determine a linear expression for approximating the positional deviation amounts of the marks measured at the measuring step, and a control step arranged to control a position of the substrate stage in accordance with a target position based on the linear expression determined at the computing step, for exposure of an exposure region on the substrate, wherein, in the computing step, the linear expression is determined in accordance with an integer programming method so as to minimize the number of marks having a difference between a mark positional deviation amount as measured at the measuring step and a mark positional deviation amount as approximated in accordance with the linear expression, which difference is out of a predetermined allowable range.

In accordance with a further aspect, the present invention provides a method of manufacturing a device, the method comprising steps of exposing a substrate to light using an exposure apparatus as recited above, developing the exposed substrate, and processing the developed substrate to manufacture the device.

These and other objects, features and advantages of the present invention will become more apparent upon a consideration of the following description of the preferred embodiments of the present invention, taken in conjunction with the accompanying drawings.

DESCRIPTION OF THE PREFERRED EMBODIMENTS

Preferred embodiments of the present invention will now be described with reference to the attached drawings.

Figure 12:
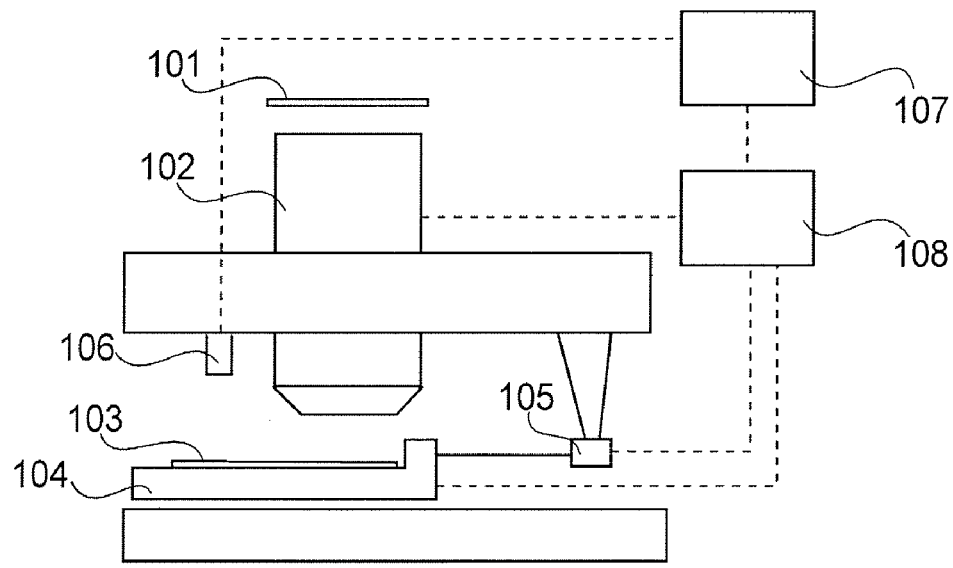
FIG. 12 is a schematic view of a general structure of an exposure apparatus according to an embodiment of the present invention.

In the manufacture of devices such as semiconductor devices, for example, an exposure apparatus, such as shown in FIG. 12, is used to expose wafers. More specifically, in the exposure apparatus of FIG. 12, a reticle (which may be called an "original" or a "mask") 101 is illuminated by an illumination optical system (not shown), and a pattern, such as a circuit pattern, formed on the reticle 101 is projected and transferred onto a wafer (which may be called a "substrate") 103 through a projection optical system 102. Here, the wafer 103 is being held by a movable wafer stage 104. The wafer stage 104 has built-in actuators. By means of these actuators, and in accordance with an output from a laser interferometer 105, which measures the position of the wafer stage 104 very precisely, the wafer stage 104 can be positioned accurately.

The wafers having completed such an exposure process are then processed by various chemical and physical treatments and, subsequently, they are loaded again into the exposure apparatus. In the exposure apparatus, the positional deviation amount (positional error) of alignment marks or registration inspection marks formed on each wafer is measured by use of a scope (e.g., a measuring device having a microscope) 106. Here, if the subject of measurement is an alignment mark, the term "positional deviation amount" means the amount of positional deviation of that mark from the position as determined by the design. If the subject of measurement is a registration inspection mark, it refers to the amount of positional deviation between two marks that constitute the registration inspection mark.

On the basis of the measurement made through the scope 106, a computing unit 107 calculates parameters (coefficients) of linear relational expressions for approximating the positional deviation amount for exposure regions (shots) on the wafer or of the marks thereon, resulting from the above-described processes or caused by wafer chucking, for example. Here, the "positional deviation" refers to a linear component, such as translation, magnification and rotation of all the exposure regions, as a whole, as well as translation, magnification and rotation in each exposure region. Alternatively, the computing unit 107 may calculate target positions of the stage 104. A control unit 108 controls the position of the stage 104 on the basis of the parameters or target position information as calculated by the computing unit 107, for exposure of the exposure regions. The control unit 108 may additionally control the aberration (e.g., projection magnification or distortion aberration) of the projection optical system 102 on the basis of the information concerning the positional deviation amount inside the exposure region. On that occasion, the projection optical system 102 may include a built-in aberration adjusting means having an optical element, which is movable or deformable to adjust the aberration, and an actuator for moving or deforming that optical element. Such aberration adjusting means may operate in accordance with information from the control unit 108.

In this embodiment of the present invention, an integer programming method, more specifically, a mixed integer programming method, which is called a "big M method," is used as a method for deriving an optimal approximation solution for positional deviation amounts (or positional errors) of the marks. Here, the mixed integer programming method is a solution method to solve an integer programming problem (mixed integer programming problem), in which discrete integer variables and continuous variables are intermingled, so as to maximize or to minimize a given objective function. On the other hand, the "big M method" is a mixed integer programming method wherein a sufficiently large constant M is used in the formulation.

The inventor of the subject application has found that, by applying a mixed integer programming method called the "big M method" in the manner to be described later, an optimum approximation solution is obtainable, as contrasted to the conventional methods.

Figure 6:
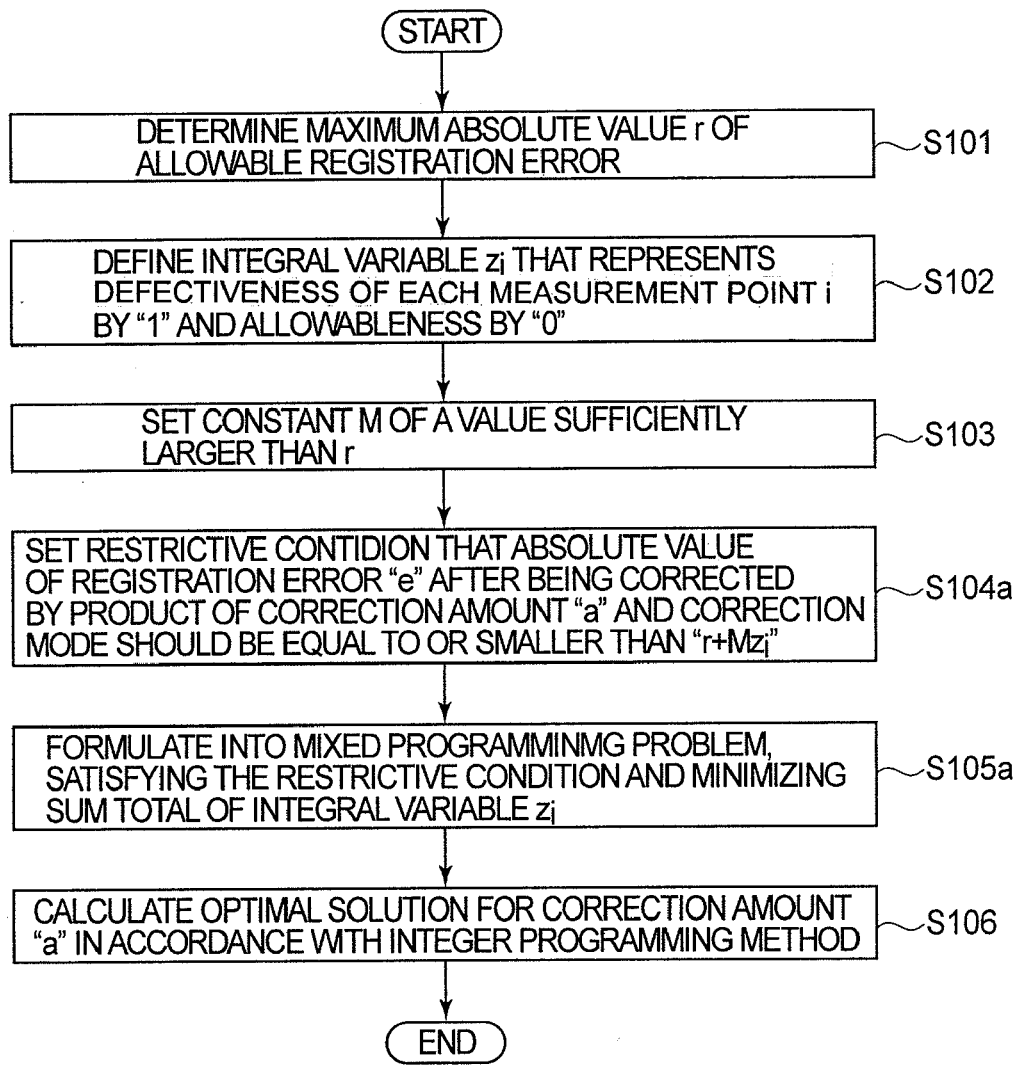
FIG. 6 is a flow chart for explaining the procedure (algorithm) according to a first embodiment of the present invention.

FIG. 6 shows the procedure according to this method. First of all, at step S101, an allowable value (allowable largest absolute value) r for the registration error (it may be the positional error of an alignment mark, in the following, the same as above) is determined. Then, at step S102, a discrete variable $z_i$ that represents whether the registration error is non-defective (within the allowable range) by zero, or defective (out of the allowable range) by one with regard to each measurement point (mark) i, is defined. Here, among integer programming problems, particularly, those in which all the variables take a value of zero or one are called a "0-1 integer programming problem". Thus, in this specification, among the above-described mixed integer programming method, particularly, those in which the integer variable stake a value of zero or one, will be referred to as a "0-1 mixed integer programming method".

Subsequently, at step S103, a constant M, by which the discrete variable $z_1$ is to be multiplied, is set. Here, M should be sufficiently larger than the expected largest registration error. For example, it may be about ten times as large as the absolute value of the expected largest registration error.

At step S104, an inequality constraint condition is set by using $r+Mz_1$. More specifically, the absolute value of the registration error should be not greater than r if the measurement point is not defective. On the other hand, if the measurement point is defective, such a condition is no longer necessary. In consideration of this, the following special sequence is introduced. That is, on the basis of the product of the above-described constant M and the variable $z_1$ that represents non-defectiveness/defectiveness of the registration error, the constraint condition for the registration error is annulled, if the measurement point is defective.

Thereafter, at step S105a, an objective function is defined so as to minimize the sum of the discrete variables $z_i$, that is, the number of measurement points where the registration is defective. Now that the above-described procedures have been completed, the remaining is only step S106, where an optimum solution can be determined in accordance with the integer programming method, which is know per se.

More specifically, there are data vectors of registration error $e_i$ (i is a subscript representing the mark, and i=1, 2, ... and m) with respect to plural measurement points (marks), and also, there are vectors of a number n (j is a subscript representing the correction mode) for approximation of the data vectors. In any of the correction mode vectors, the number of elements $u_{ji}$ is m, and the error $e_i$ is approximated on the basis of the linear sum of the correction mode vectors as defined by Equation (2) below. Also, a constraint condition is applied so that the absolute value of the difference between the approximate value and the error $e_i$ becomes equal to or less than the registration allowable value r.

Minimization:

$$\sum_{i=1}^{m} z_i \quad (1)$$

Constraint Condition:

$$\left| e_i - \sum_{j=1}^{n} a_j u_{ji} \right| \leq r + M z_i \quad z \in \{0, 1\}, a_j \in R \quad (2)$$

wherein $a_i$ is a real-number variable, and $z_i$ is an integral variable that takes zero or one. The remaining $e_i$ and $u_i$, and r and M are real-number constants.

The objective function to be minimized is the sum of $z_i$. Here, M should have a value sufficiently larger than the possible largest value of the registration error. However, the smaller the M is, the shorter the calculation time is. Therefore, too large a value should not be chosen.

On the other hand, another example of a 0-1 mixed integer programming problem, being formulated to be described below, may be useful, not only in that the number of non-defective chips is maximized, but also, in that the largest absolute value of the registration error within the allowable range is minimized.

Figure 7:
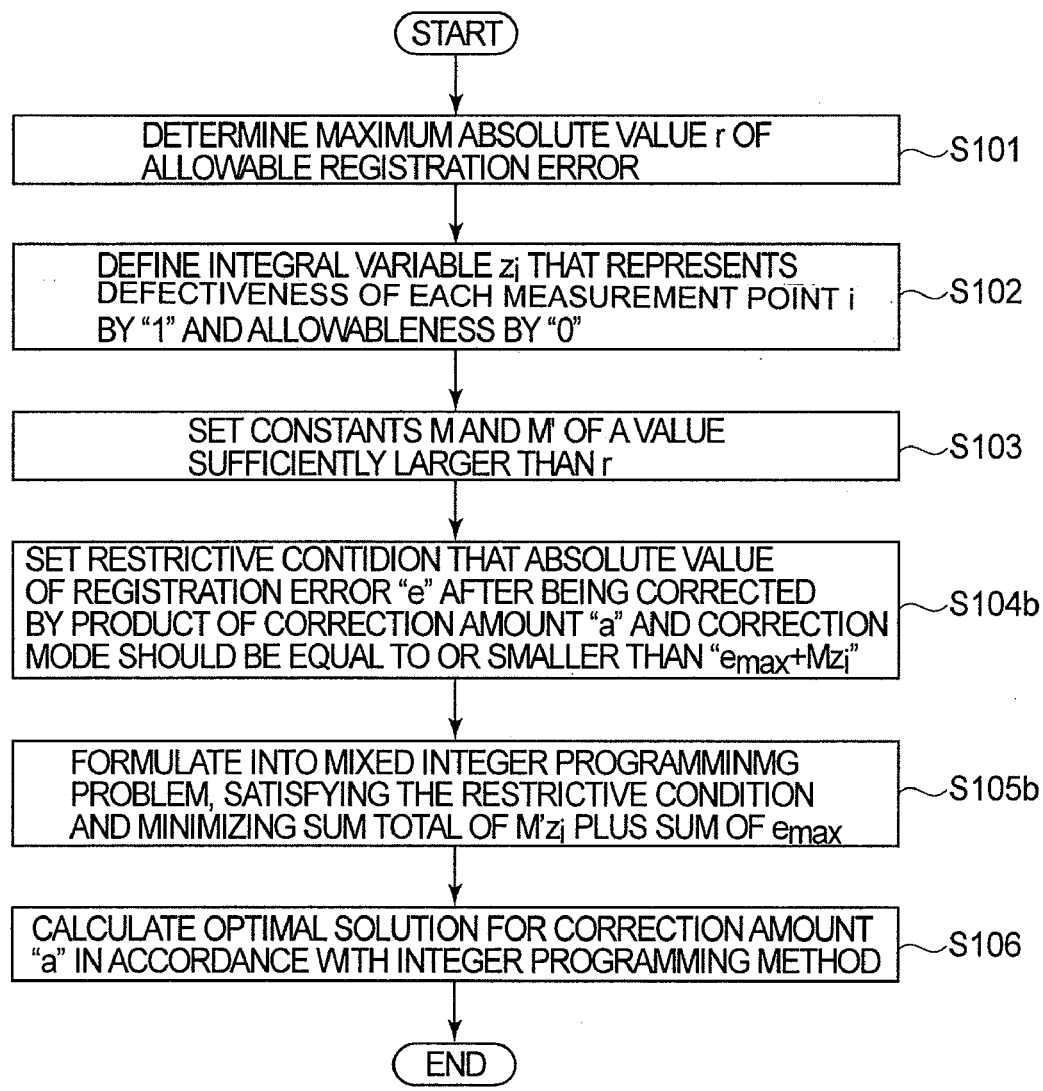
FIG. 7 is a flow chart for explaining the procedure (algorithm) according to a second embodiment of the present invention.

FIG. 7 shows the procedure of the 0-1 mixed integer programming method, according to a second embodiment of the present invention.

First of all, at step S101, an allowable value r for the registration error is determined. At step S102, a discrete variable representing whether the registration error is non-defective by zero or defective by one, with regard to each measurement point (mark) i, is defined. Subsequently, at step S103, a constant M by which the discrete variable $z_i$ is to be multiplied is set. Here, M should be sufficiently larger than the expected largest registration error.

At step S104, an inequality constraint condition is set by using $e_{max} + M z_i$. More specifically, it is defined that the absolute value of the registration error within the allowable range (i.e., not greater than the allowable value) should be not greater than $e_{max}$. Thereafter, at step S105b, an objective function that includes the sum of the value $e_{max}$ and $M'z_i$ is defined. Here M' is a sufficiently large real-number constant of a positive value and, like M described hereinbefore, it may have a value sufficiently larger than the expected largest registration error.

Now that the above-described procedures have been completed, the remaining is only step S106 where an optimum solution for minimizing the objective function can be determined in accordance with the integer programming method, which is known per se.

Minimization:

$$M' \sum_{i=1}^{m} z_i + e_{max} \quad (3)$$

Constraint Condition:

$$\left| e_i - \sum_{j=1}^{n} a_j u_{ji} \right| \leq e_{max} + M z_i, z \in \{0, 1\}, a_j \in R, 0 \leq e_{max} \leq r \quad (4)$$

In the exposure apparatus described above, the arithmetical operation according to the 0-1 mixed integer programming method are carried out by means of the computing unit 107, and positional errors of the alignment marks (or registration inspection marks) on the wafer or, alternatively, the target positions of the stage 104, are determined. The control unit 108 controls the position of the stage 104 on the basis of the positional error information or target position information calculated by the computing unit 107, for exposure of the exposure regions. Furthermore, the control unit 108 may control the aberration of the projection optical system 102, such as projection magnification and distortion aberration, for example, on the basis of the information related to the positional errors inside the exposure region.

In accordance with the embodiments of the present invention described hereinbefore, the number of non-defective exposure regions having registration errors within the allowable range can be maximized, and thus, the productivity of devices, such as semiconductor devices, can be improved significantly.

EXAMPLES

Now, specific examples according to the present invention will be explained.

Figure 1:
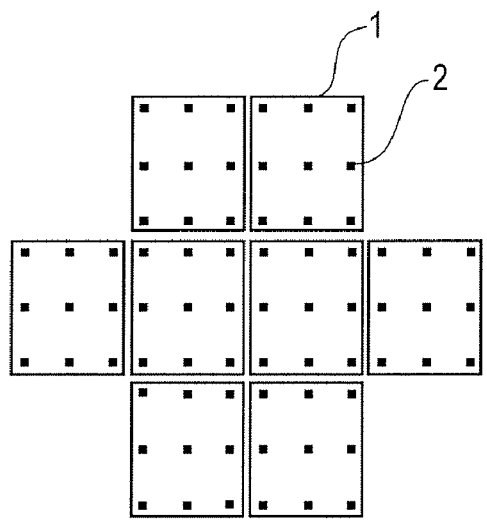
FIG. 1 is a schematic view for explaining an example of an array of shots, each having plural registration marks formed therein.
Figure 2:
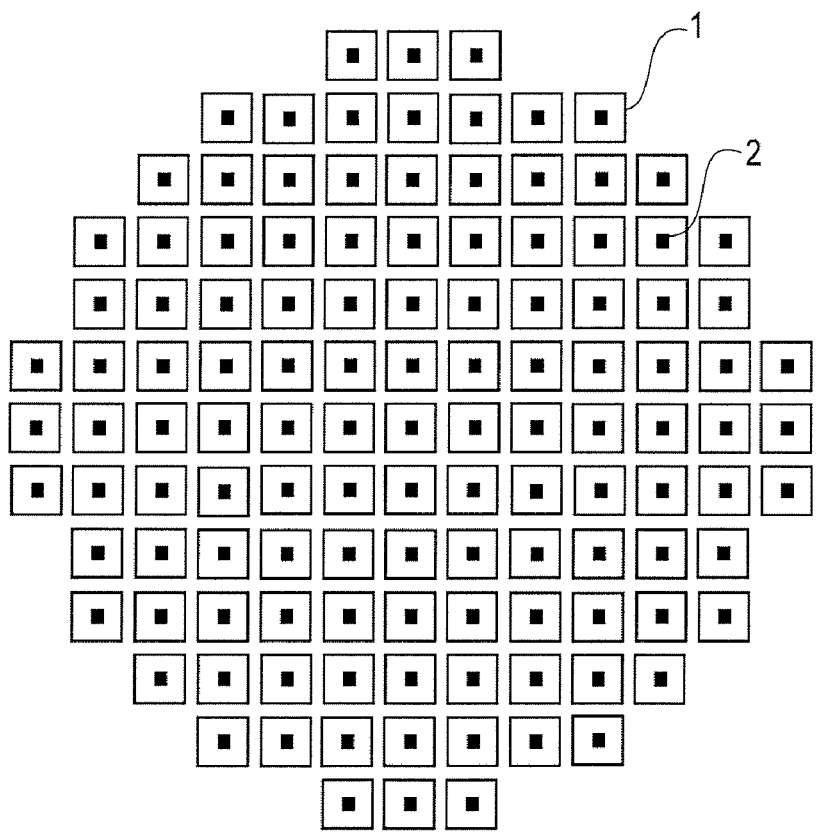
FIG. 2 is a schematic view for explaining an example of an array of shots, each having a single registration mark formed therein.
Figure 3:
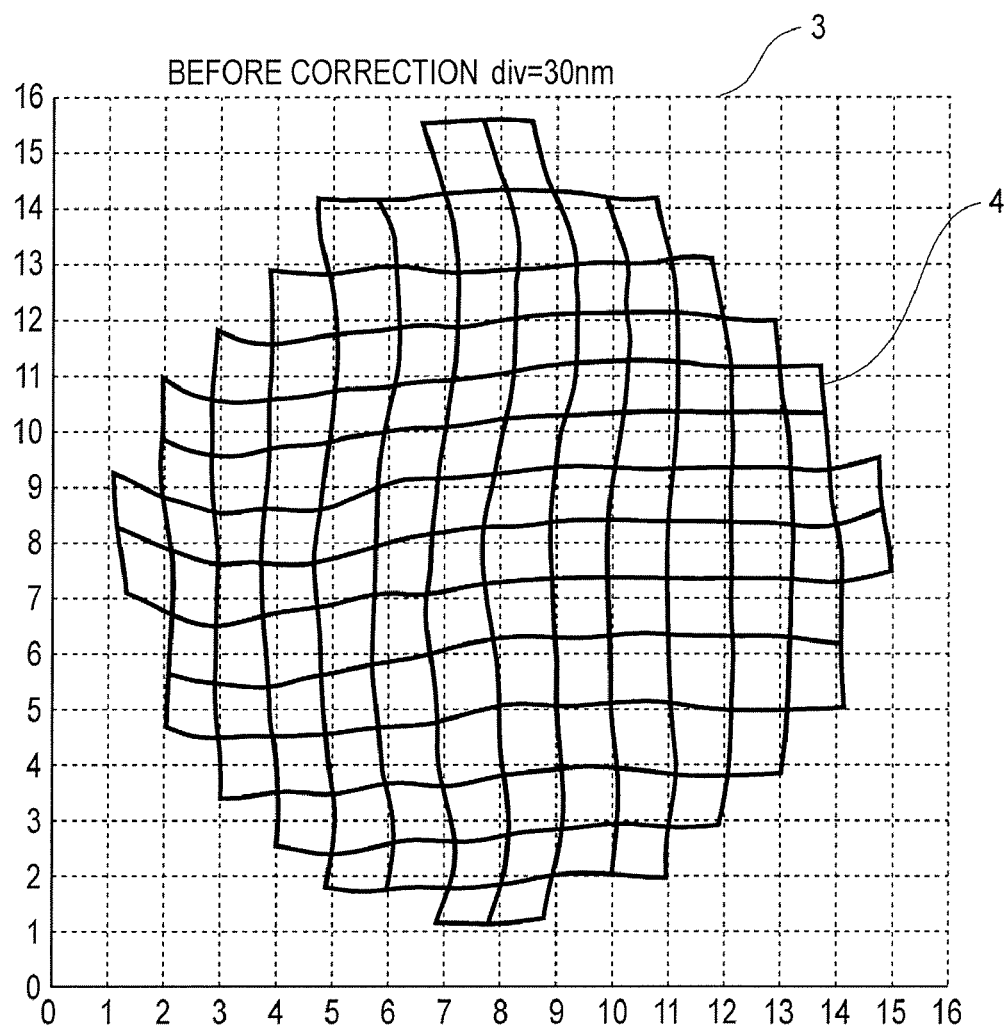
FIG. 3 is a map showing distortion of the shot array.
Figure 4:
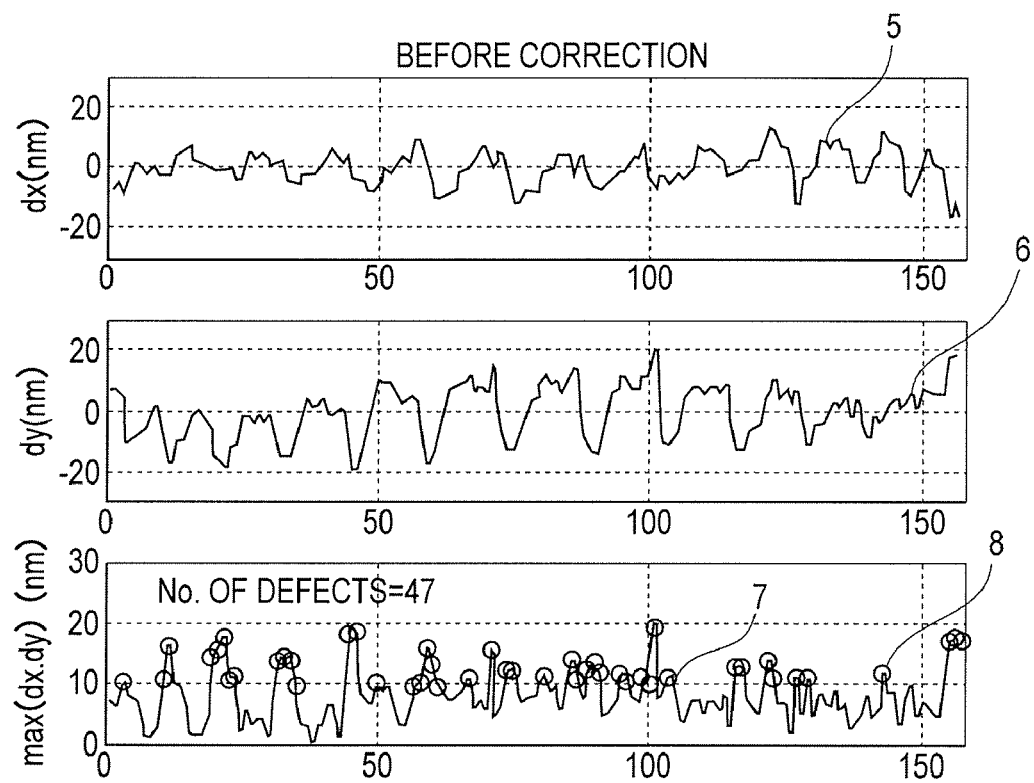
FIG. 4 is a graph for explaining registration errors before correction, as well as measurement points having registration errors beyond an allowable range.
Figure 5:
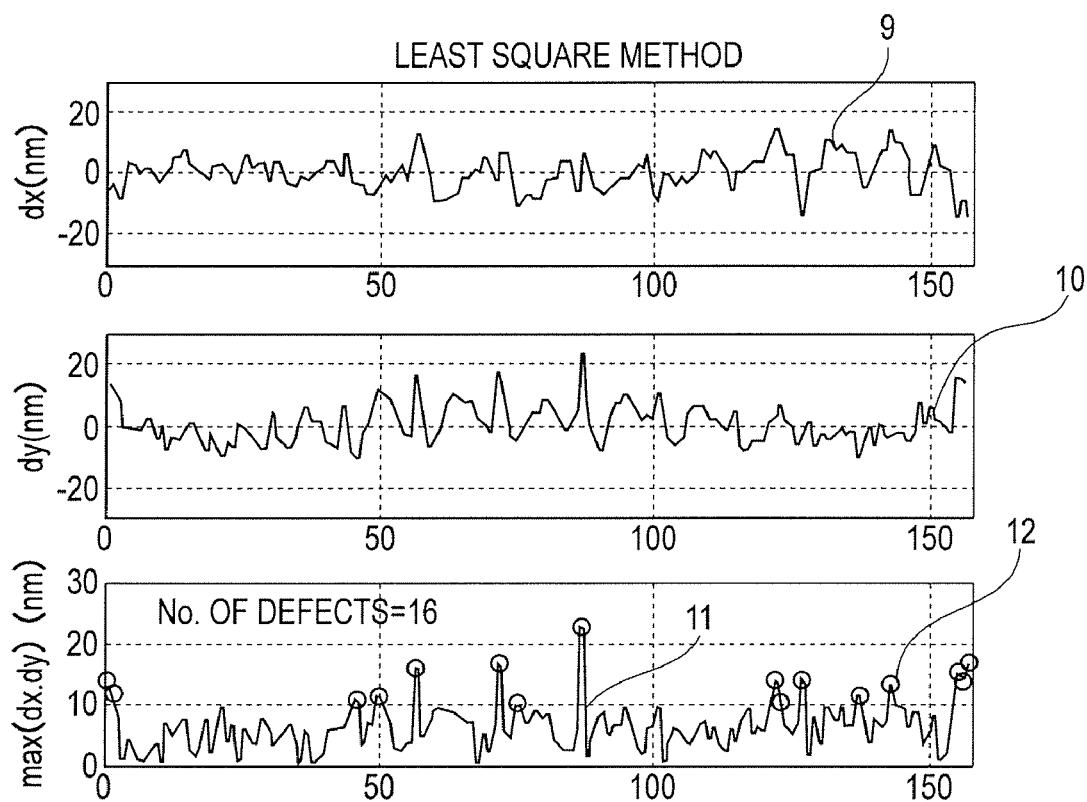
FIG. 5 is a graph for explaining registration errors after being corrected in accordance with the least square method, as well as measurement points having registration errors beyond an allowable range.

A first example of the present invention will be as follows. The sample discussed with reference to FIGS. 2-4 was used in this example. The problem was formulated in accordance with the mixed integer programming model of Equation (1) and Equation (2), so that the number of marks having a registration error beyond the allowable range was minimized. Then, an optimum approximation solution was derived in accordance with the mixed integer programming method.

Figure 8:
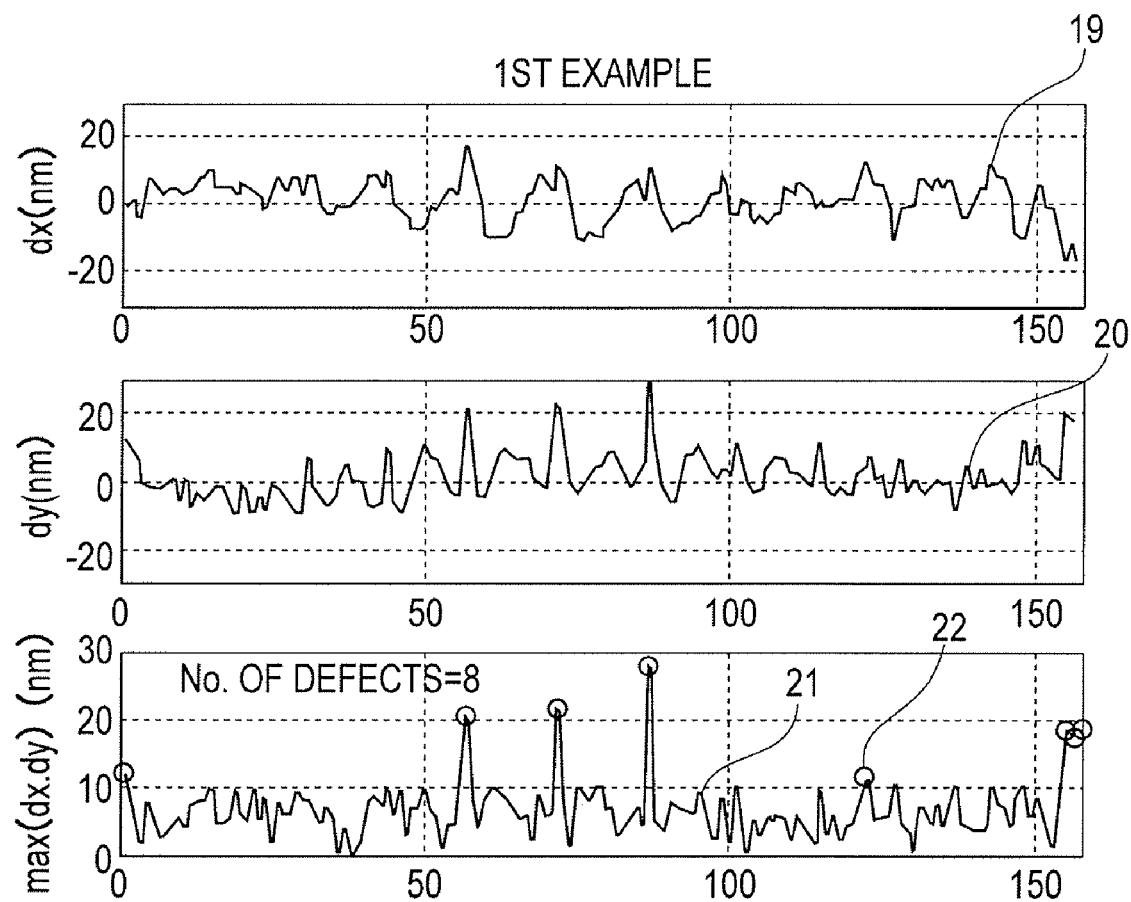
FIG. 8 is a graph for explaining registration errors after being corrected in accordance with a method of a first example according to the present invention, as well as measurement points having registration errors beyond an allowable range.

FIG. 8 shows, at curves 19 and 20, the deviation amounts (positional errors) in the x and y directions, respectively, after being corrected in accordance with the method of the first example. Those points on the curves 19 and 20 having a relatively large absolute value were chosen and plotted as a curve 21. Defective measurement points (marks), having a registration error greater than the allowable value, were circled, like circles 22. The number of defective measurement points with registration errors beyond the allowable value decreased to eight, and thus, it has been confirmed that the correction is much better than what is attainable by the conventional method based on the least square method.

Figure 9:
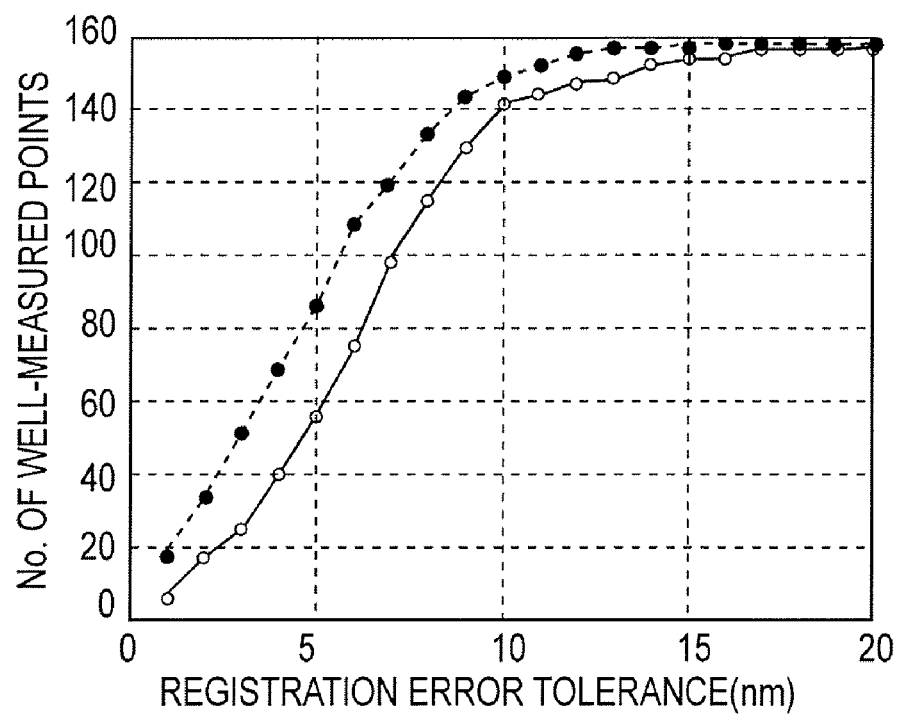
FIG. 9 is a graph for explaining the difference in advantageous effect between the least square method and the method according to the first example of the present invention.

FIG. 9 shows the comparison results wherein, in comparison with the result based on the least square method, the number of measurement points having registration errors not greater than the allowable value (tolerance) was counted, while sequentially increasing the allowable value for registration error from 1 nm, by increments of 1 nm. Curve 23 in FIG. 9 plots the number of measurement points having registration errors not greater than the allowable value, with the correction being made in accordance with the least square method. Curve 24 plots the number of measurement points having registration errors not greater than the allowable value, with the correction being made in accordance with the method of this example. It is seen from the drawing that, at any condition for an allowable value, the method of this example shows superiority.

Figure 10:
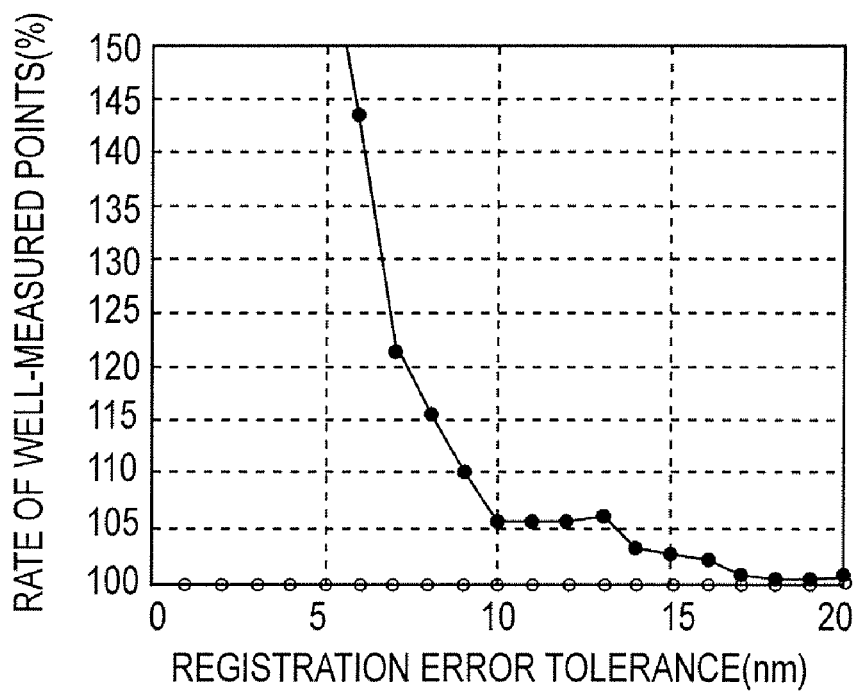
FIG. 10 is a graph for explaining the significance of improvements attainable with the method of the first example of the present invention, as compared with the least square method.

FIG. 10 shows, in this connection, the increase (in terms of percentage) of the number of measurement points having registration errors not greater than the allowable value (tolerance). Curve 25 in FIG. 10 depicts the rate of increase of the measurement points having registration errors within the allowable range, as attainable with the method of this example, when the number of measurement points having registration errors within the allowable range as attainable by the correction based on the least square method is taken as 100%. It is seen from this graph that the smaller the allowable value is, the greater the advantageous effect is of this example.

Next, a second example of the present invention will be explained.

In this example, the problem was formulated in accordance with the mixed integer programming model of Equation (3) and Equation (4), so that the number of marks having registration errors beyond the allowable range was minimized, and also that, with regard to those marks having registration errors within the allowable range, the largest value of the deviation amount thereof was minimized. Then, an optimum correction amount was derived in accordance with the mixed integer programming method. Although, in this example, the measurement points having registration errors within the allowable range are the same as those corrected by the method of the first example, the largest absolute value of the registration error of these measurement points is made smaller than that of the first example. Hence, a superior approximate solution in regard to the allowable value of registration error has been derived.

Figure 11:
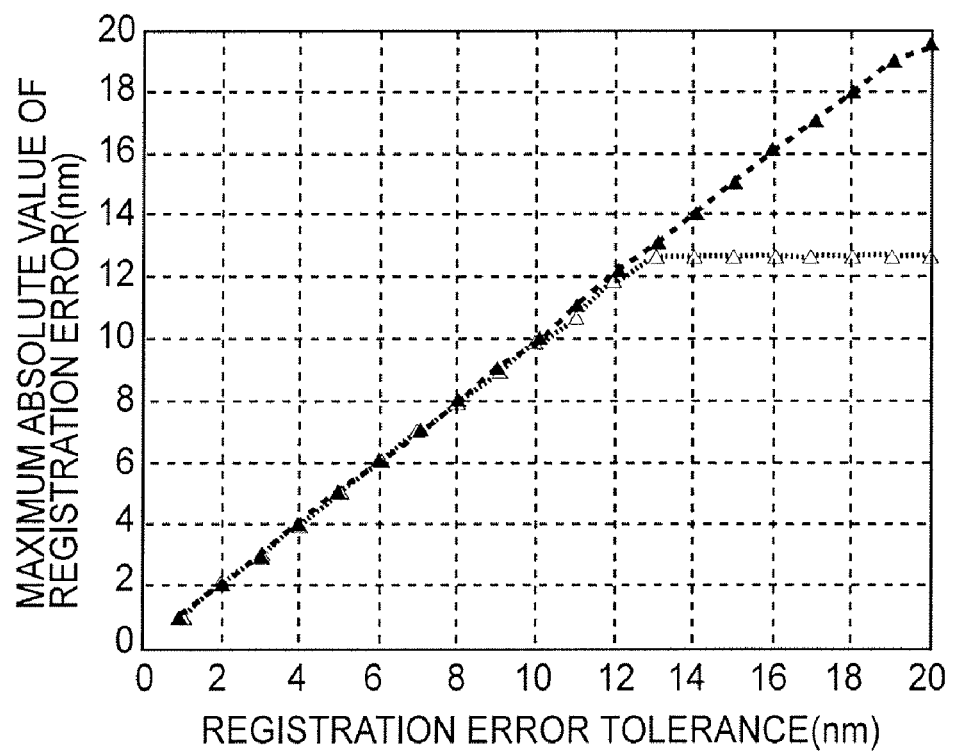
FIG. 11 is a graph for explaining the difference in results between the method according to the first example and the method according to a second example of the present invention.

FIG. 11 shows the result of a comparison of the first and second examples. The curves in FIG. 11 plot the absolute value of the largest registration error within the allowable range, when the errors were corrected in accordance with the methods of the first and second examples, respectively, while sequentially increasing the allowable value for the registration error from 1 nm, by increments of 1 nm. It is seen from this graph that, although the difference between the results of the first and second examples is small when the allowable value is small, if the allowable value increases to some extent, the values 26, according to the second example, become a little smaller. Furthermore, it is seen that, after the measurement points having a registration error beyond the allowable range disappear, the solution of the second example (i.e., the absolute value of the largest registration error) becomes constant. Hence, after that, the difference with respect to the value 27 of the first example becomes larger, and this means that the system becomes less susceptible to adverse influences of correction errors.

[Embodiment of a Device Manufacturing Method]

Next, an embodiment of a device manufacturing method, which uses an exposure apparatus described above, will be explained. This embodiment is applied to the manufacture of semiconductor devices, as an example.

Figure 13:
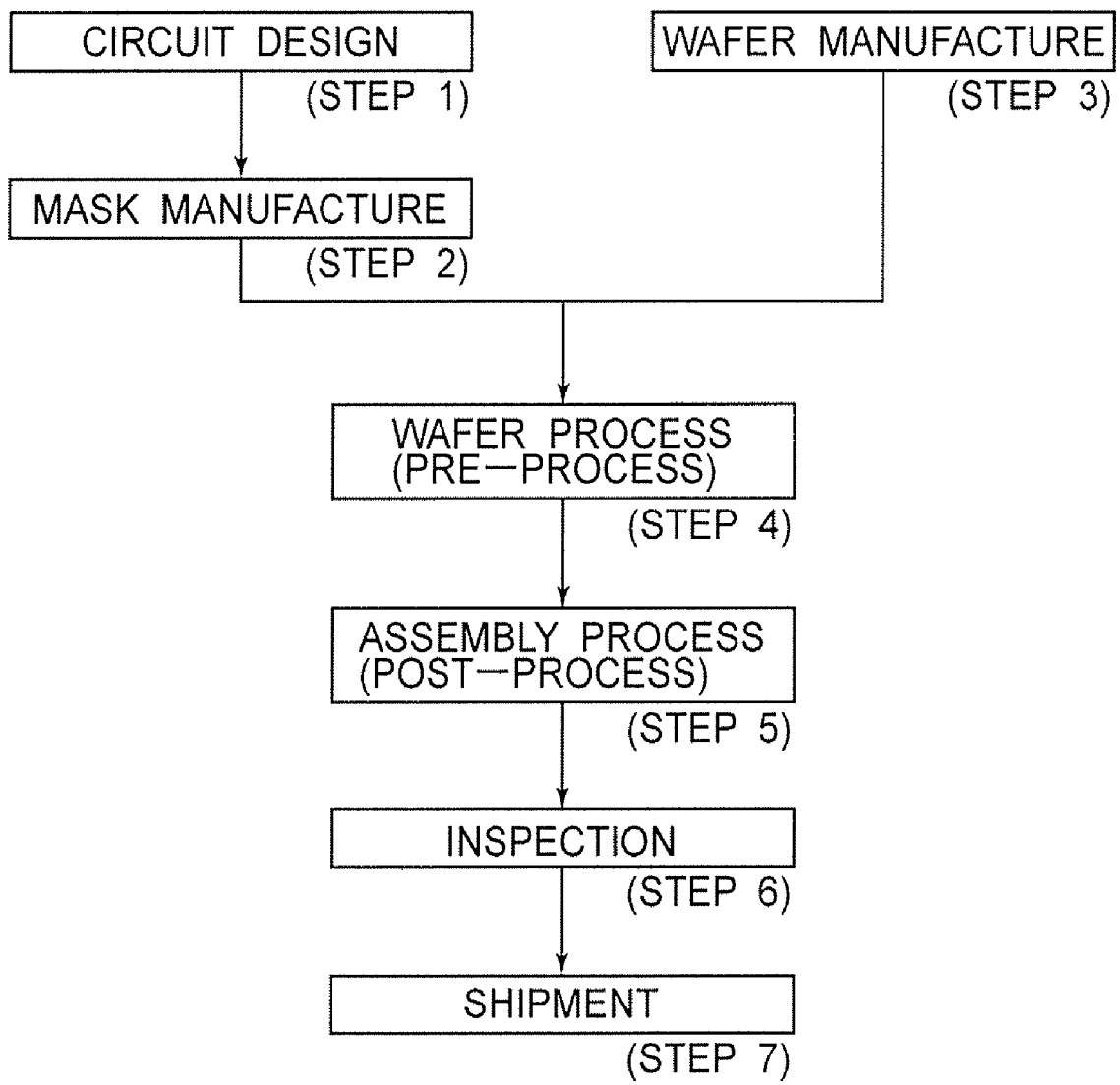
FIG. 13 is a flow chart for explaining the flow of semiconductor device manufacturing processes.

FIG. 13 is a flow chart for explaining a general procedure of semiconductor device manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with a lithography process. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 14:
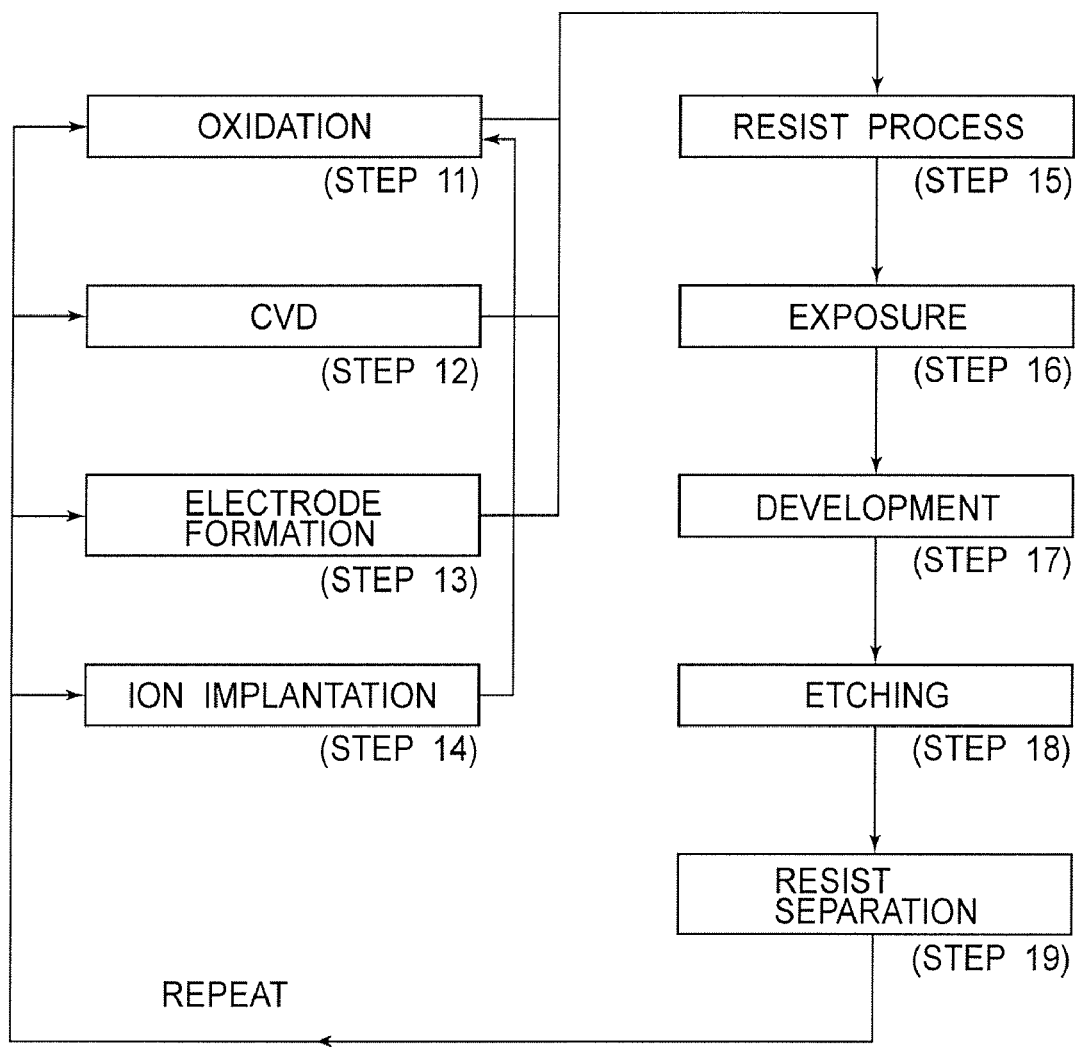
FIG. 14 is a flow chart for explaining details of a wafer process shown in the flow chart of FIG. 13.

FIG. 14 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer, through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the embodiments of the present invention as described hereinbefore, a unique and an improved exposure apparatus and a method, and a device manufacturing method, are provided, by which a linear relational expression for approximating positional deviation amounts of measured marks, for example, can be defined.

While the invention has been described with reference to the structures disclosed herein, it is not confined to the details set forth, and this application is intended to cover such modifications or changes as may come within the purposes of the improvements or the scope of the following claims.

What is claimed is:

1. An exposure apparatus for exposing a substrate to light, said apparatus comprising:

a substrate stage configured to hold the substrate and to be moved;

a measuring device configured to measure a positional deviation amount of a mark on the substrate held by said substrate stage;

a computing device configured to determine a coefficient of a linear expression that approximates the measured positional deviation amount of each mark and is linear with respect to a term including at least one of an X coordinate to the Nth power and a Y coordinate to the Nth power, where N is an integer not less than zero; and a control device configured to control a position of said substrate stage in accordance with a target position determined based on the linear expression to expose a shot to the light, wherein said computing device is configured to determine the coefficient in accordance with an integer programming method so as to minimize a number of marks, each of which satisfies a condition that a difference between the measured positional deviation amount and the approximated positional deviation amount is out of a predetermined allowable range.

2. An apparatus according to claim 1, wherein said measuring device is configured to measure a positional deviation amount of one of an alignment mark and a registration inspection mark formed on the substrate.

3. An apparatus according to claim 1, further comprising a projection optical system configured to project light from an original onto the substrate, wherein said control device is configured to control aberration of said projection optical system in accordance with information representing a positional deviation amount in the shot that is calculated based on the linear expression.

4. An apparatus according to claim 1, wherein, when r is a real-number constant representing the allowable range, $z_i$ is a variable that takes zero when the difference is within the allowable range and one when the difference is out of the allowable rang; i is a subscript representing the mark, $e_i$ is the mark positional deviation amount, $u_{tj}$ is a real-number constant, j is a subscript representing a correction mode, $a_j$ is a real-number variable, and M is a real-number constant larger than r, said computing device is configured to determine $a_j$ in accordance with the integer programming method so that $$\sum_{i=1}^{m} z_i$$

is minimized under a constraint condition of $$\left| e_i - \sum_{j=1}^{n} a_j u_{ji} \right| \le r + M z_i.$$

5. An apparatus according to claim 1, wherein said computing device is further configured to determine the coefficient in accordance with the integer programming method so that, with regard to those marks, each of which satisfies a condition that the difference is within the predetermined allowable range, a largest value of the difference is minimized.

6. An apparatus according to claim 5, wherein, when r is a real-number constant representing the allowable range, $z_i$ is a variable that takes zero when the difference is within the allowable range and one when the difference is out of the allowable range, i is a subscript representing the mark, $e_i$ is the mark positional deviation amount, $u_{ji}$ is a real-number constant, j is a subscript representing a correction mode, $a_j$ is a real-number variable, M and M' are real-number constants larger than r, and $e_{max}$ is a real-number variable not less than zero and not greater than r, said computing device is configured to determine $a_j$ in accordance with the integer programming method so that $$M' \sum_{i=1}^{m} z_i + e_{max}$$

is minimized under a constraint condition of $$\left| e_i - \sum_{j=1}^{n} a_j u_{ji} \right| \le e_{max} + M z_i.$$

7. An exposure method of exposing a substrate to light, said method comprising:
 a measuring step of measuring positional deviation amounts of marks on a substrate held by a substrate stage;
 a computing step of determining a coefficient of a linear expression that approximates the positional deviation and is linear with respect to a term including at least one of an X coordinate to the Nth power and a Y coordinate to the Nth power, where N is an integer not less than zero; and
 a control step of controlling a position of the substrate stage in accordance with a target position determined based on the linear expression to expose a shot on the substrate to light,
 wherein, in said computing step, the coefficient is so determined in accordance with an integer programming method as to minimize the number of marks, each of which satisfies a condition that a difference between the measured positional deviation amount and the approximated positional deviation amount is out of a predetermined allowable range.

8. A method according to claim 7, wherein, in said measuring step, a positional deviation amount of one of an alignment mark and a registration inspection mark formed on the substrate is measured.

9. A method according to claim 7, wherein, in said control step, aberration of a projection optical system for projecting light from an original onto the substrate is controlled in accordance with information, representing a positional deviation amount in the shot that is calculated based on the linear expression.

10. A method according to claim 7, wherein, when r is a real-number constant representing the allowable range, $z_i$ is a variable that takes zero when the difference is within the allowable range and one when the difference is out of the allowable rang; i is a subscript representing the mark, $e_i$ is the measured positional deviation amount, $u_{ji}$ is a real-number constant, j is a subscript representing a correction, mode, $a_j$ is a real-number variable, and M is a real-number constant larger then r, said computing step determines $a_j$ in accordance with the integer programming method so that $$\sum_{i=1}^{m} z_i$$

is minimized under a constraint condition of $$\left| e_i - \sum_{j=1}^{n} a_j u_{ji} \right| \le r + M z_i.$$

11. A method according to claim 7, wherein said computing step is further arranged to determine the coefficient in accordance with the integer programming method so that, with regard to those marks, each of which satisfies a condition that the difference is within the predetermined allowable range, the largest value of the differences of these marks is minimized.

12. A method according to claim 11, wherein, when r is a real-number constant representing the allowable range, $z_i$ is a variable that takes zero when the difference is within the allowable range and one when the difference is out of the allowable range, i is a subscript representing the mark, $e_i$ is the measured positional deviation amount as measured at said measuring, $u_{ji}$ is a real-number constant, j is a subscript representing a correction mode, $a_j$ is a real-number variable, M and M' are real-number constants larger than r, and $e_{max}$ is a real-number variable not less than zero and not greater than r, said computing step determines $a_j$ in accordance with the integer programming method so that $$M' \sum_{i=1}^{m} z_i + e_{max}$$

is minimized under a constraint condition of $$\left| e_i - \sum_{j=1}^{n} a_j u_{ji} \right| \leq e_{max} + M z_i.$$

13. A method of manufacturing a device, said method comprising steps of:
    exposing a substrate to light using an exposure apparatus as defined in claim 1 to produce an exposed substrate;
    developing the exposed substrate to produce a developed substrate; and
    processing the developed substrate to manufacture a device.

* * * * *